United States Patent [19]
Balsara et al.

[11] Patent Number: 6,130,559
[45] Date of Patent: Oct. 10, 2000

[54] QMOS DIGITAL LOGIC CIRCUITS

[75] Inventors: Poras T. Balsara, Plano, Tex.; Kamal J. Koshy, Santa Clara, Calif.

[73] Assignee: Board of Regents of the University of Texas System, Austin, Tex.

[21] Appl. No.: 09/052,768

[22] Filed: Mar. 31, 1998

Related U.S. Application Data

[60] Provisional application No. 60/041,936, Apr. 4, 1997.

[51] Int. Cl.[7] .................. H03K 19/094; H03K 19/082
[52] U.S. Cl. .................. 326/121; 326/121; 326/119; 326/112; 326/132; 326/133; 326/134; 708/505; 708/670
[58] Field of Search .................. 326/132, 133, 326/134, 135, 104, 112, 119, 121, 17, 53; 708/505, 670; 257/25

[56] References Cited

U.S. PATENT DOCUMENTS

| | | | |
|---|---|---|---|
| 3,609,329 | 9/1971 | Martin | 235/176 |
| 4,716,308 | 12/1987 | Matsuo et al. | 307/303 |
| 5,247,298 | 9/1993 | Wei et al. | 341/133 |
| 5,265,044 | 11/1993 | Singh | 364/784 |
| 5,402,012 | 3/1995 | Thomas | 326/97 |
| 5,469,163 | 11/1995 | Taddiken | 341/83 |
| 5,477,169 | 12/1995 | Shen et al. | 326/132 |
| 5,543,748 | 8/1996 | Ando | 327/570 |
| 5,563,530 | 10/1996 | Frazier et al. | 326/132 |
| 5,654,558 | 8/1997 | Meyer et al. | 257/25 |
| 5,714,891 | 2/1998 | Lin et al. | 326/59 |
| 5,721,503 | 2/1998 | Burns et al. | 327/199 |
| 5,903,170 | 5/1999 | Kulkarni et al. | 326/134 |

*Primary Examiner*—Michael Tokar
*Assistant Examiner*—Vibol Tan
*Attorney, Agent, or Firm*—Jenkens & Gilchrist

[57] ABSTRACT

Circuit designs of basic digital logic gates are disclosed using Resonant Tunneling Diodes (RTDs) and MOSFETs, which reduces the number of devices used for logic design, while exploiting the high speed negative differential resistance (NDR) characteristics of RTDs. Such logic circuits include NAND, NOR, AND, and OR gates and Minority/Majority circuits, which are used in full adder circuits. By implementing RTDs along with conventional MOSFETs, the use of series connected MOSFETs, which results in low output rise and fall times, especially for a large number of inputs, can be avoided. Furthermore, the RTD logic design styles do not require the use of resistors or any elaborate clocking or resetting scheme.

24 Claims, 16 Drawing Sheets

| Logic Gate | CMOS | | | Fixed Pull-up Logic | | | |
|---|---|---|---|---|---|---|---|
| | #NFETs | #PFETs | Delay | #NFETs | #PFETs | #RTDs | Delay |
| AND | 3 | 3 | 90ps | 3 | 2 | 1 | 80ps |
| OR | 3 | 3 | 100ps | 3 | 2 | 1 | 100ps |
| Majority | 6 | 6 | 170ps | 4 | 2 | 1 | 90ps |

QMOS DIGITAL LOGIC CIRCUITS

This appln claims benefit of provisional appln Ser. No. 60/041,936 Apr. 4, 1997

BACKGROUND OF THE PRESENT INVENTION

1. Field of the Invention

The present invention relates generally to the use of resonant tunneling devices in logic circuits, and particularly to the use of resonant tunneling diodes and conventional MOSFETs within logic circuits and adder circuits.

2. Background and Objects of the Present Invention

Modern integrated circuits rely on scaling of numerous electronic devices in order to perform various tasks almost instantaneously. In order to create and scale these electronic devices, a combination of semiconductor materials can be used. A semiconductor is an element with a valence of four, which means that an isolated atom of the material has four electrons in its outer or valence orbit. Electrons in the valence orbit are only weakly attracted by the nucleus of the atom, and thus, can be dislodged from the valence orbit to become free electrons. When a free electron is dislodged from the valence orbit, a vacancy is left in the valence orbit, called a hole. The hole behaves like a positive charge, which will attract and capture any electron in the immediate vicinity.

A semiconductor, e.g., silicon or germanium, can be doped to have an excess of free electrons or an excess of holes. A semiconductor material that has been doped with a pentavalent impurity, which has five valence electrons, is called an n-type semiconductor. In n-type semiconductors, the free electrons outnumber the holes, and therefore, the flow of the free electrons (majority carriers) has a much greater effect on the conductivity of the material than the holes (minority carriers). A semiconductor material doped with a trivalent impurity, which has three valence electrons, is called a p-type semiconductor. In such p-type semiconductor material, the holes are the majority carriers and the free electrons are the minority carriers.

One electronic device containing a combination of both p-type and n-type semiconductor material is a diode. When a diode is forward biased, e.g., a negative dc source terminal is connected to the n-type material and a positive dc source terminal is connected to the p-type material, current flows through the circuit because the free electrons in the n-type material and the holes in the p-type material flow towards the junction between the n-type and p-type material. The free electrons in the n-type material combine with the holes in the p-type material to become valence electrons, which can then move through the holes in the p-type material and enter the external circuit to flow towards the positive source terminal.

When the dc source is turned around, such that the negative source terminal is connected to the p-type material and the positive source terminal is connected to the n-type material, the connection is reverse-biased, and current does not flow. This is due to the fact that the holes and free electrons are now attracted toward the source terminals, and therefore, flow away from the junction between the p-type and n-type material (pn junction), thus creating a wide depletion layer. A depletion layer is an area at the pn junction, which contains pairs of positive and negative ions, created by the flow of holes and electrons away from the pn junction.

However, when a diode is heavily doped, the depletion layer is very narrow, and thus the electric field across the depletion layer is very intense. Therefore, when the diode is reverse biased and the field strength reaches approximately 300,000 Volts/centimeter, the field is intense enough to pull electrons out of their valence orbits, which is known as the Zener effect. By increasing the doping level even further, a tunnel diode is created, which exhibits a phenomenon known as negative resistance, which means that an increase in forward voltage produces a decrease in forward current, at least over part of the forward curve. A resonant tunneling diode (RTD) is functionally similar to a tunneling diode, except that it is based upon the resonance of the electron wave function within a quantum well, which is a layer of sufficiently thin narrow-band gap material surrounded by a wide-band gap material. The well is flanked by thin layers of material (comparable to the electron wavelengths), called tunnel barriers, which are slightly transparent to the electron wave. At resonance, the RTD exhibits a pronounced current peak followed by a region of negative differential resistance (NDR). An RTD is a bi-stable device, which means that it can support two stable states with a transient state connecting them.

Another device which utilizes n-type and p-type semiconductor material is the transistor. As shown in FIG. 1 of the drawings, one type of transistor, known as the enhancement-mode Metal Oxide Semiconductor Field Effect Transistor (MOSFET), is made up of two layers of n-type material, the source 10 and the drain 20, separated by a layer of p-type material 30 (called the substrate) to create an NMOSFET. Alternatively, two layers of p-type material can be separated by a layer of n-type material to create a PMOSFET, which works in the same way as an NMOSFET, except that the voltages and currents are reversed. Both the NMOSFET and the PMOSFET contain an insulated gate 40 overlying the semiconductor body 10, 20 and 30, which includes a metallic layer 45 overlying a thin layer of silicon dioxide 42, or other insulator. When the gate voltage (Vgs) is zero, the current between the source 10 and the drain 20 is negligible. However, when the gate voltage (Vgs) is positive enough, e.g., above a threshold voltage, the gate 40 attracts minority carriers into a surface channel 50, forming a conductive path between the source 10 and the drain 20. As additional attractive charges are placed on the gate 40 side, e.g., the gate voltage (Vgs) is increased, the channel 50 side draws a balancing of minority carriers from the source 10 and the drain 20 and the channel 50 width increases, thereby increasing the current. In addition, by increasing the source-drain voltage (Vdd), the current between the source 10 and the drain 20 increases approximately linearly at low source-drain voltages (Vdd).

Complementary MOS (CMOS) circuits can be built using PMOSFETs and NMOSFETs, such that when one device is on, e.g., current is flowing, the other device is off. The key advantage to using CMOS design is its extremely low power consumption, which makes the design popular in calculators, digital watches and satellites. For example, CMOS circuits can be used in various logic circuits, such as AND, OR, NAND, NOR, and XOR circuits. For example, a CMOS NAND gate can be constructed using two PMOSFET's in parallel, one for each input, with each PMOSFET having an NMOSFET in series with it.

Another type of CMOS logic circuit, illustrated in FIG. 2 of the drawings, is the MOSFET inverter switch, which is essentially turned off and has a very high channel resistance by applying the same potential to the gate terminals ($V_{G1}$ and $V_{G2}$) of the PMOSFET $Q_1$ and NMOSFET $Q_2$ as to the source terminal ($V_{DD}$). For example, the NMOSFET $Q_2$ is turned on and has a very low channel resistance when a high voltage with respect to the source ($V_{DD}$) is applied to the gate ($V_{G2}$), and the PMOSFET $Q_1$ is turned on and has a very low channel resistance when a negative voltage with respect to the source ($V_{DD}$) is applied to the gate ($V_{G1}$). Therefore, when a high voltage is applied to the input, the PMOSFET $Q_1$ will be turned off and the NMOSFET $Q_2$ will be turned on, which will cause the output voltage to be low. Alternatively, when a low voltage is applied to the input, the PMOSFET $Q_1$ will be turned on and the NMOSFET $Q_2$ will be turned off, which will cause the output voltage to be high.

CMOS logic style gates with multiple inputs require multiple MOSFETs in series, which increases the propagation delay. For example, as shown in FIG. 3 of the drawings, in a multiple input CMOS OR/NOR circuit, by increasing the number of input voltages ($V_{in1}$, $V_{in2}$, ... $V_{ini}$, $V_{inj}$), and thus the number of respective input NMOSFET transistors ($n_1$, $n_2$, ... $n_i$, $n_j$) in parallel, the number of PMOSFET transistors ($p_1$, $p_2$, ... $p_i$, $p_j$) in series also increases, which increases the propagation delay since the output ($V_{nor}$) has to charge or discharge through a series of transistors ($p_1$, $p_2$, ... $p_i$, $p_j$) before it can be fed through an inverter, which includes an additional PMOSFET (Pa) and NMOSFET (Na), to generate the OR signal ($V_{or}$).

It is, therefore, an object of the invention to decrease the propagation delay in digital logic circuits.

It is a further object of the invention to reduce the number of devices which need to be implemented within a digital logic circuit.

SUMMARY OF THE INVENTION

The present invention is directed to circuit designs of basic digital logic gates using Resonant Tunneling Diodes (RTDs) and MOSFETs, which reduces the number of devices used for logic design, while exploiting the high speed negative differential resistance (NDR) characteristics of RTDs. Such logic circuits include NAND, NOR, AND, and OR gates and Minority/Majority circuits, which are used in full adder circuits. By implementing RTDs along with conventional MOSFETs, the use of series connected MOSFETs, which results in low output rise and fall times, especially for a large number of inputs, can be avoided. Furthermore, the RTD logic design styles do not require the use of resistors or any elaborate clocking or resetting scheme.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 9 is a table comparing the performance results for conventional CMOS circuits and fixed pull-up QMOS circuits.

DETAILED DESCRIPTION OF THE PRESENTLY PREFERRED EXEMPLARY EMBODIMENTS

The numerous innovative teachings of the present application will be described with particular reference to the presently preferred exemplary embodiments. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Quantum devices, such as resonant tunneling diodes (RTDs), described hereinbefore, and resonant tunneling bipolar transistors (RTBT) have recently attracted attention due to their high speed negative differential resistance (NDR) region in their current-voltage (I–V) characteristics. These devices display multiple on/off switching transitions as a function of their control inputs so that an entire logic function can be provided by a single switching component. The unique I–V characteristics of RTDs have the potential to reduce the number of devices required to perform computation, and hence are most suited for applications requiring high density ultra-high performance digital circuits. Recent advances in fabrication, particularly in molecular beam epitaxy (MBE), have made possible the co-integration of RTDs with a number of conventional devices, such as MOSFETs. These circuits are referred to as QMOS (Quantum MOSFET) circuits because of the use of both quantum devices (RTDs) and MOSFETs.

Two different QMOS logic styles can be created using RTDs in conjunction with MOSETs: (1) fixed pull-up, which is responsible for pulling the output to logic "1", and varying pull-down, which pulls the output to logic "0"; and (2) varying pull-up and fixed pull-down. The fixed pull-up and varying pull-down QMOS circuit configuration can be created by using a fixed current-voltage (I–V) characteristic pull-up load, and changing the pull-down I–V characteristics depending upon the input logic combination. For the pull-up load, the QMOS circuits can use a grounded gate PMOSFET, which is similar to the pseudo-NMOS design style in CMOS technology, as is understood in the art. The changing pull-down circuit can be created using an RTD and NMOSFET combination. The logic inputs can be applied to the gate terminals of the NMOSFETs, so that the I–V characteristics of the pull-down network can be changed based on input combinations. This results in a change in circuit behavior yielding different operating points for different input combinations.

Figure 1:
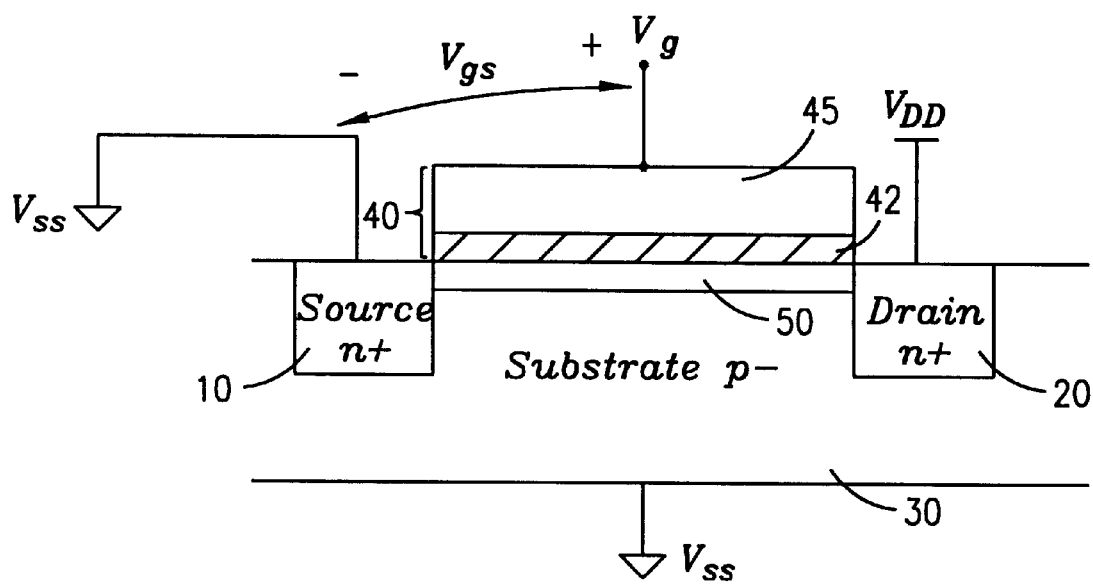
FIG. 1 illustrates a conventional enhancement-mode Metal Oxide Semiconductor Field Effect Transistor (MOSFET)
Figure 2:
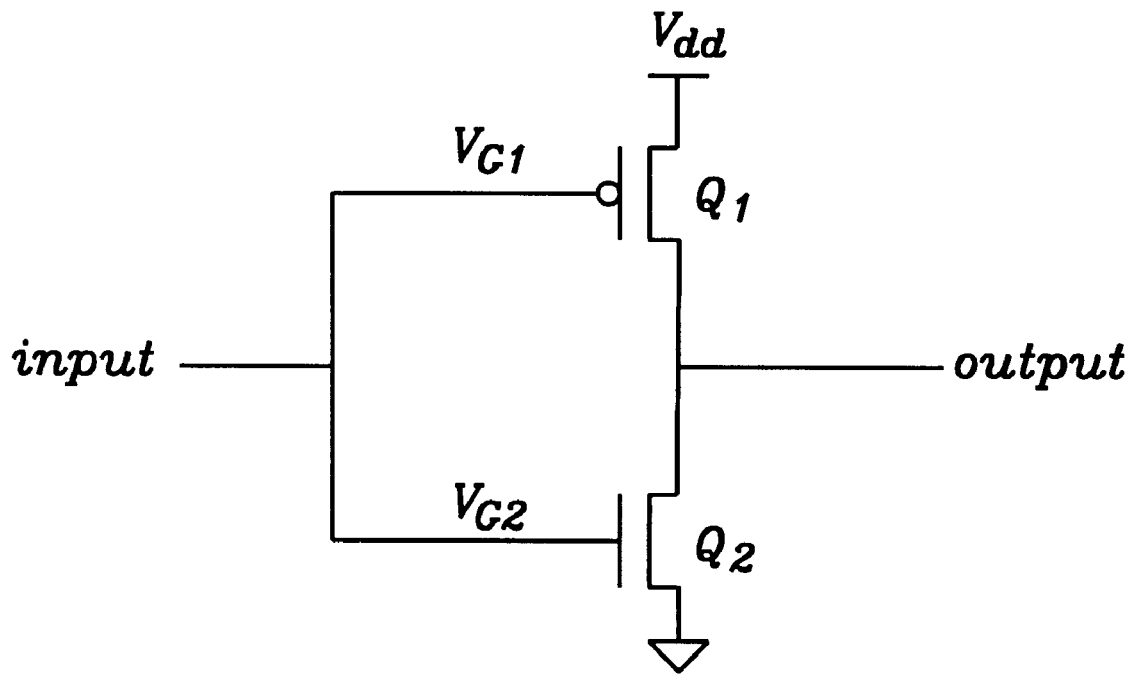
FIG. 2 shows a conventional MOSFET inverter switch.
Figure 3:
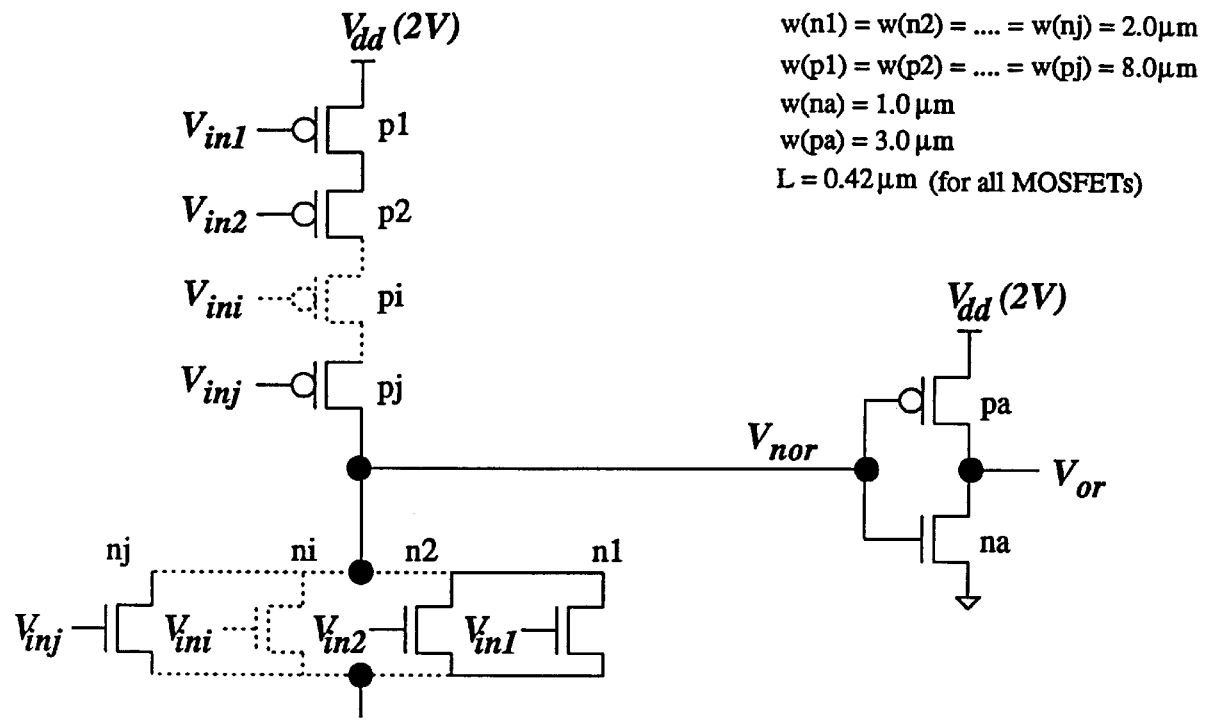
FIG. 3 is a circuit diagram for a conventional multiple-input Complementary MOS (CMOS) NOR/OR circuit.
Figure 4A:
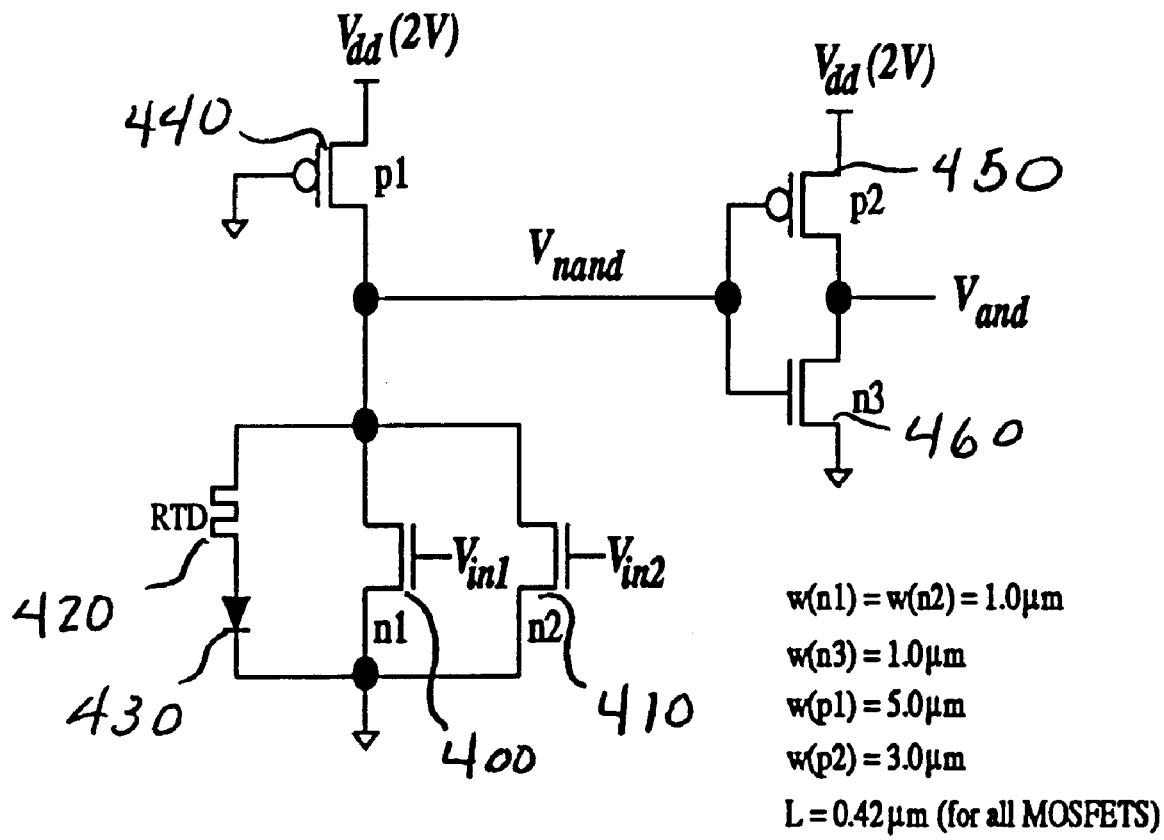
FIGS. 4A–4C depict circuit diagrams and current-voltage (I–V) characteristics for fixed pull-up QMOS NAND/AND and NOR/OR logic circuits.

For example, with reference now to FIG. 4A of the drawings, in one embodiment of the fixed pull-up networks of the present invention, a NAND/AND gate can be created by varying the pull-down I–V characteristics based upon the value of the inputs $V_{in1}$ and $V_{in2}$. These inputs are connected to the gates of respective NMOSFETs 400 and 410, which are placed across the RTD 420, all of which comprise the pull-down circuit. The pull-up load uses a grounded gate PMOSFET 440 connected in series with the pull-down circuit. The pull-down current, and hence the output of the first stage ($V_{nand}$), is changed depending upon the number of NMOSFETs 400 and 410 that are turned on, e.g., the number of NMOSFETS 400 and 410 that have a voltage applied to their gate.

Figure 4B:
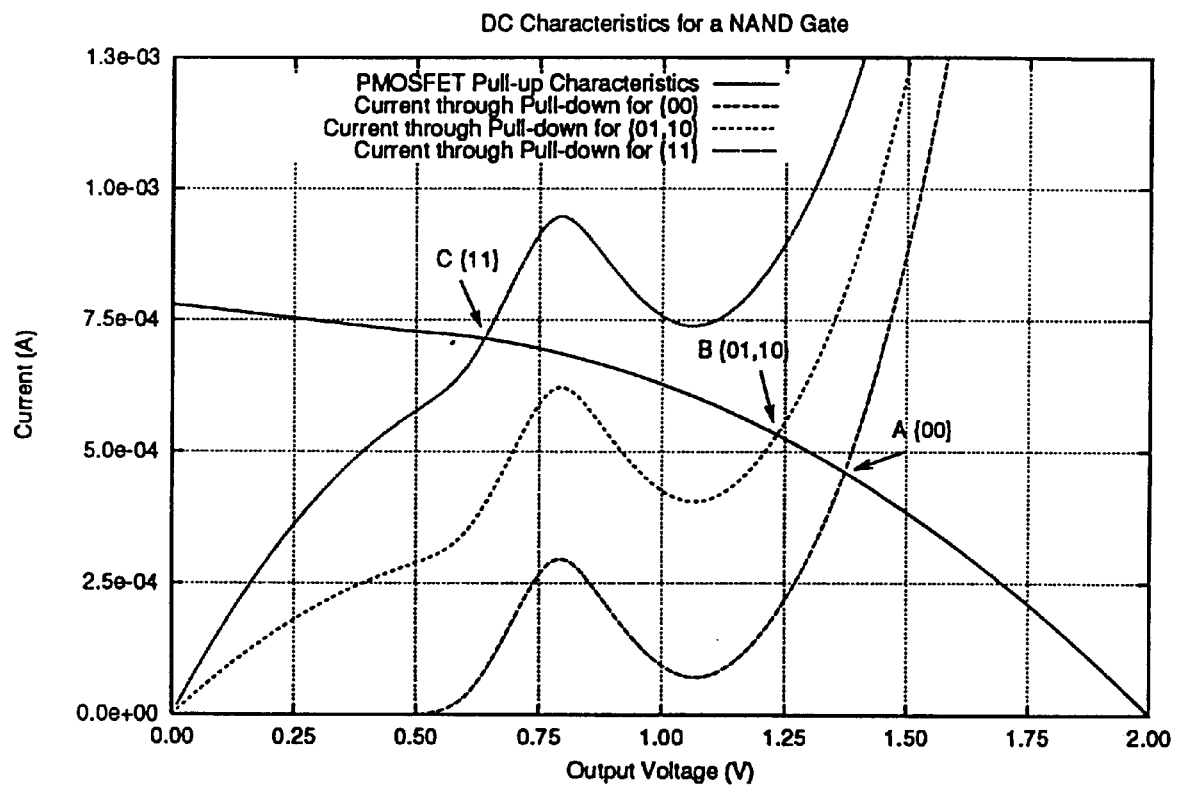

The three pull-down I–V characteristics, which are based upon the number of inputs "on", are shown in FIG. 4B of the drawings. As can be seen, the intersection of each of the three RTD 420 NDR curves with the PMOSFET 440 I–V curve results in three points of operation (A,B and C). A diode 430 shown in series with the RTD 420 shifts the RTD 420 NDR characteristics to the right in order to intersect the PMOSFET 440 I–V curve at the correct points. It should be understood that the diode 430 is not needed for an RTD 420 fabricated with these NDR characteristics. First, when both NMOSFETs 400 and 410 are off or at logic "0", e.g., low (0 Volts) voltage is applied to their gates, the output at point A is at logic "1". Second, when only one of the NMOSFETs 400 and 410 is on or at logic "1", the output at point B is at logic "1", and finally, when both NMOSFETs 400 and 410 are on, the output at point C is at logic "0".

This output from the first stage ($V_{nand}$) is fed through an inverter, which consists of a PMOSFET 450 and an NMOS-FET 460 connected in series to which the output ($V_{nand}$) is applied to their gates. The inverter 450 and 460 generates an AND output and restores the logic level. As an example, if the voltages $V_{in1}$ and $V_{in2}$ for this circuit are 0 Volts for logic "0" and 2 Volts for logic "1", the output at $V_{nand}$ is $\leq 0.64$ Volts for logic "0", and $\geq 1.23$ Volts for logic "1". In addition, at the output node ($V_{and}$), the voltages are $\leq 0.12$ Volts for logic "0", and $\geq 1.98$ Volts for logic "1".

Figure 4C:
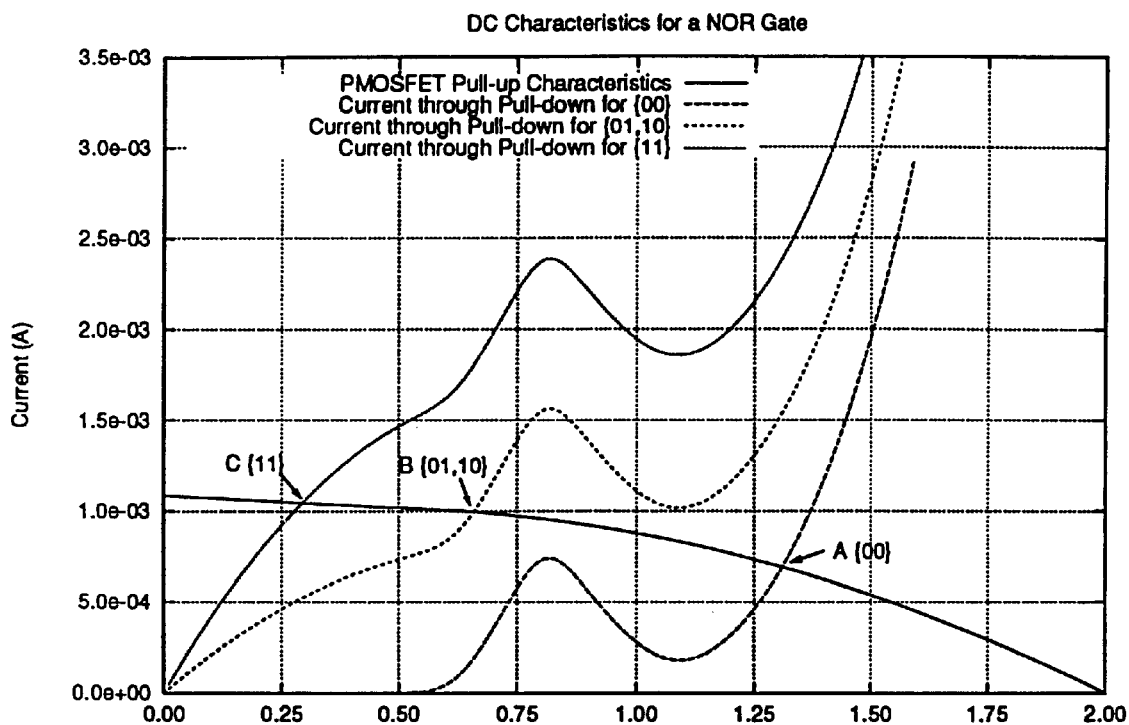

In another fixed pull-up embodiment of the present invention, a NOR/OR function can be created by moving the PMOSFET 440 I–V characteristics shown in FIG. 4B below the center pull-down I–V curve, so that the point B moves to the left and yields output "0" for input combinations "01" and "10". This shift in the PMOSFET 440 DC characteristics is depicted in FIG. 4C of the drawings. As can be seen, the circuit now operates with output logic "1" at point A for inputs "00", and with output logic "0" at points B and C for inputs "01" or "10", and "00", respectively. This change in the PMOSFET 440 DC characteristics can be achieved, for example, by decreasing the size of the channel in the PMOSFET 440 relative to the sizes of the RTD 420 and NMOSFETs 400 and 410. As an example, for $V_{in1}$ and $V_{in2}$ with voltages of 0 Volts for logic "0" and 2 Volts for logic "1", the output voltage ($V_{nor}$) is $\leq 0.66$ Volts for logic "0", and $\geq 1.31$ Volts for logic "1". Furthermore, the voltages at the output ($V_{or}$) are $\leq 0/04$ Volts for logic "0", and $\geq 1.97$ Volts for logic "1".

Figure 5A:
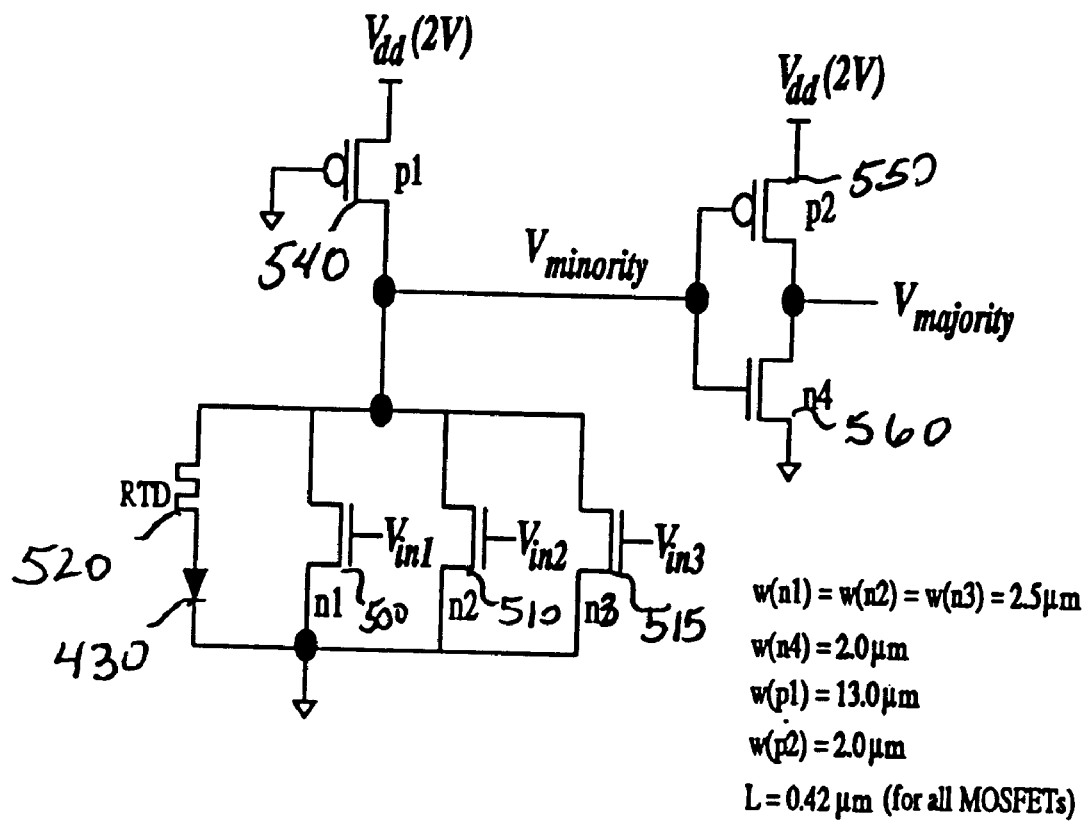
FIGS. 5A and 5B show a circuit diagram and I–V characteristics for a fixed pull-up QMOS Minority/Majority circuit.

In a further alternative fixed pull-up embodiment, as shown in FIG. 5A of the drawings, a compact implementation of a Minority/Majority gate can be created by a slight modification to the NAND and NOR circuits depicted in FIG. 4A of the drawings. This modification consists of adding a third transistor 515 to the two transistors 500 and 510 in parallel with the RTD 520 in the pull-down network of the NAND and NOR circuits, which can be used as a third input ($V_{in3}$) control.

Figure 5B:
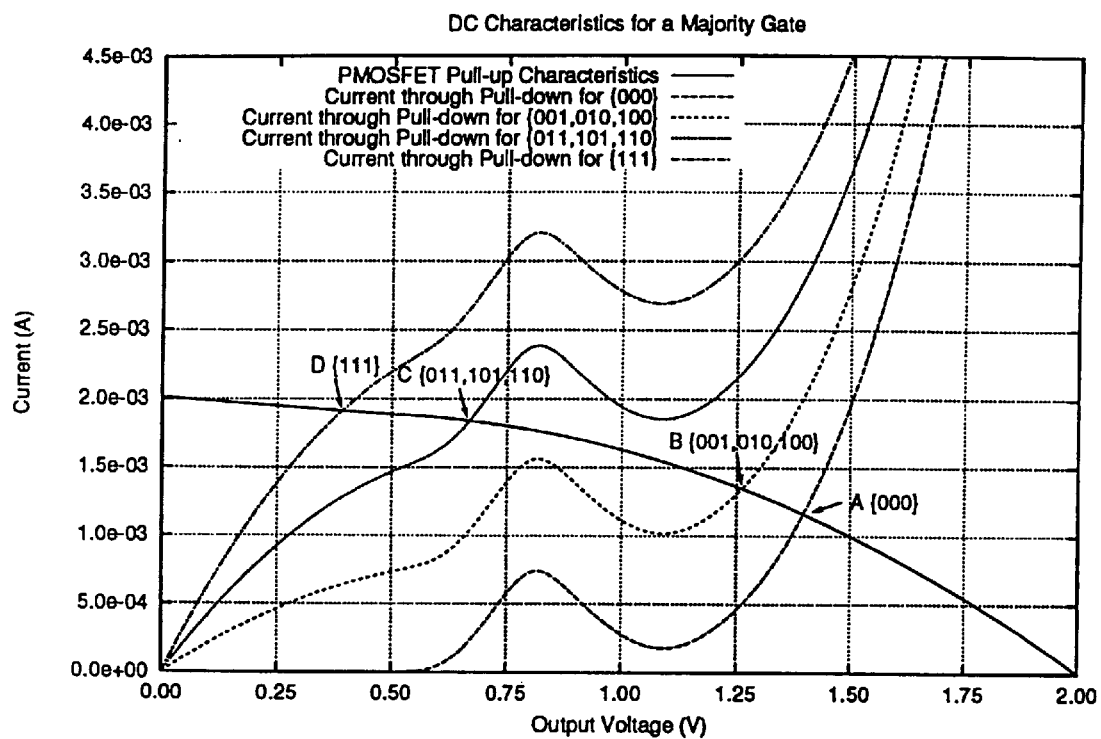

In addition, as shown in FIG. 5B of the drawings, the characteristics of the PMOSFET 540 in the pull-up network and the NMOSFETs 500, 510 and 515 in the pull-down network can be adjusted by modifying the device channel sizes, such that the pull-up PMOSFET 540 characteristic intersects the I–V characteristics for an input of "111" at point D, which gives an output at $V_{minority}$ of logic "0" (or $V_{majority}$ of logic "1"). In addition, the modification also allows an output at $V_{minority}$ of logic "0" for inputs "011", "101" and "110", illustrated by the intersection at point C. Furthermore, for inputs "000" and "001", "010" or "100", the intersections at points A and B, respectively, give an output at $V_{minority}$ of logic "1" (or $V_{majority}$ of logic "0"). By feeding the output at $V_{minority}$ through an inverter, which consists of a PMOSFET 550 and an NMOSFET 560 in series, a $V_{majority}$ output is generated.

Figure 6A:
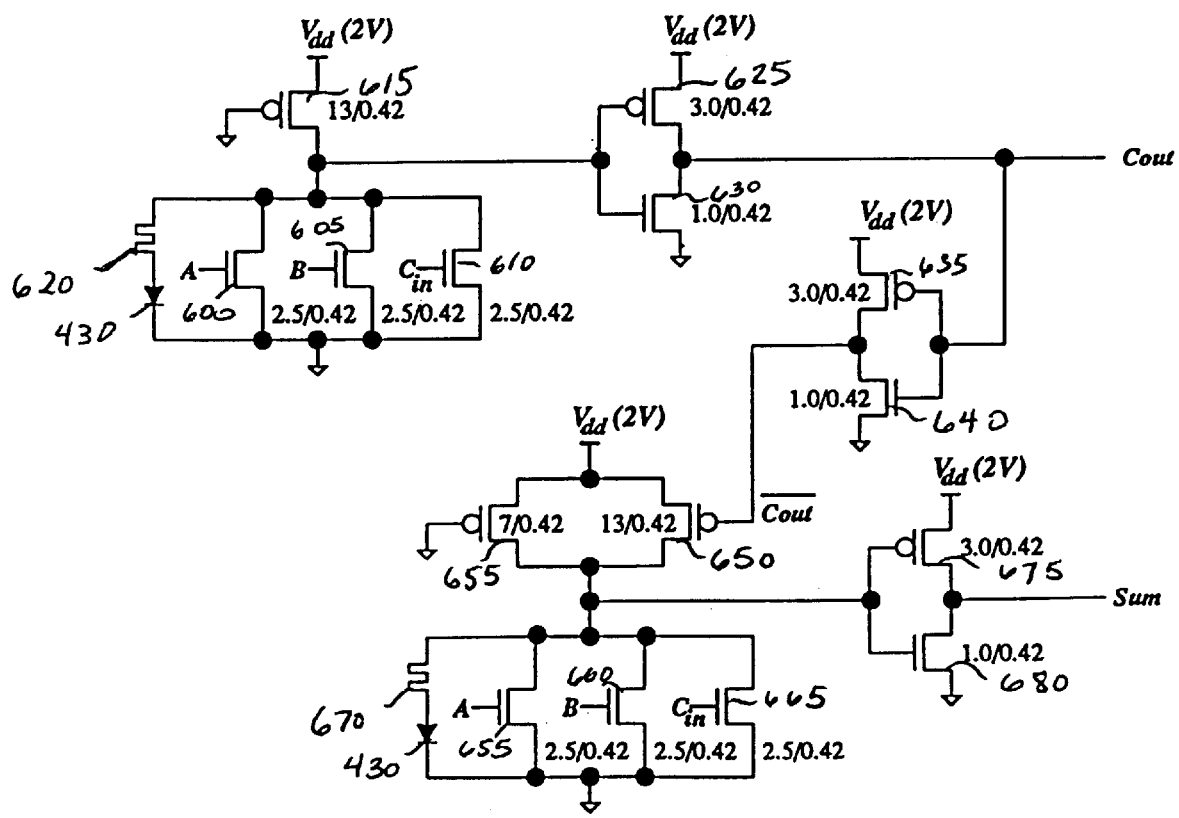
FIGS. 6A and 6B illustrate the implementation of a QMOS Minority/Majority circuit within a full adder circuit.

With reference now to FIG. 6A of the drawings, a Minority/Majority circuit of the type described hereinabove can be used in a full adder circuit, which accepts three inputs A, B and $C_{in}$ to produce two outputs Sum and Carry out ($C_{out}$). The $C_{out}$ for an adder can be implemented using a majority circuit and the Sum can be implemented using a complementary $C_{out}$ circuit. This is accomplished by using an RTD 620 in parallel with three input NMOSFET transistors 600, 605 and 610 in the pull-down network and a single PMOSFET 615 in the pull-up network in the $C_{out}$ circuit and an additional RTD 670 in parallel with three input NMOSFET transistors 655, 660 and 665 in the pull-down network and a single PMOSFET 655 in the pull-up network in the complementary $C_{out}$ (or Sum) circuit. After the $V_{majority}$ signal is generated by feeding the output $V_{minority}$ through an inverter, consisting of a PMOSFET 625 and an NMOSFET 630, the $C_{out}$ signal is fed through another inverter, consisting of an additional PMOSFET 635 and an additional NMOSFET 640 to create a $\overline{C_{out}}$ signal, which drives the gate of an additional PMOSFET 650 in parallel with the PMOSFET 655 of the pull-up network of the Sum circuit. Therefore, the load (PMOSFET 650) characteristics are modified depending upon the $\overline{C_{out}}$ input. The output of the Sum circuit is fed through a final inverter, consisting of another PMOSFET 675 and NMOSFET 680, to generate the Sum output.

Figure 6B:
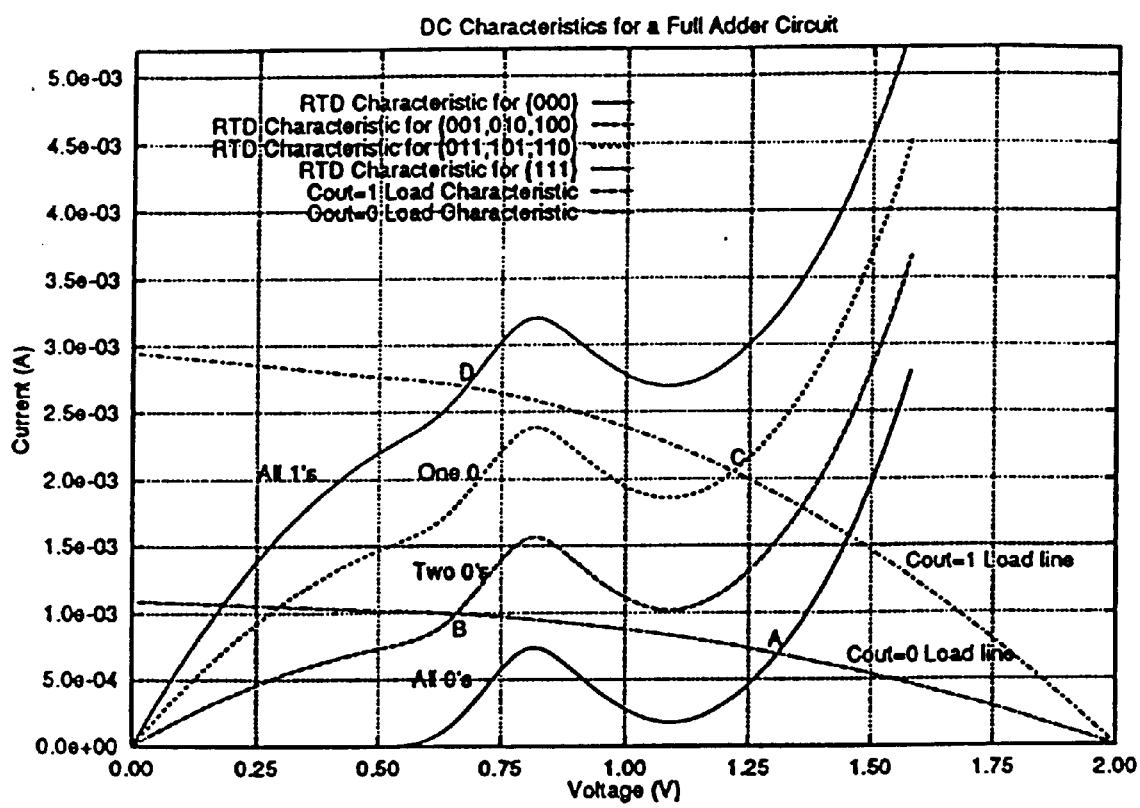

The DC characteristics for the Sum output of the full adder circuit are shown in FIG. 6B. The four RTD 670 NDR curves are same as that for the minority function depicted in FIG. 5B. However, in addition to changing RTD 670 characteristics depending upon the inputs, the PMOSFET 650 load curve is also moved. This is achieved by the additional PMOSFET 650 driven by the $\overline{C_{out}}$ signal. Points D and C correspond to inputs of the NMOSFETs 655, 660 and 665 of "111" and "011", "101", or "110", respectively, and to an input of logic "1" to the additional PMOSFET 650 from the $C_{out}$ signal, whereas points A and B correspond to inputs to the NMOSFETs 655, 660 and 665 of "000" and "001", "010", or "100", respectively, and to an input of logic "0" to the additional PMOSFET 650 from the $C_{out}$ signal.

Figure 7A:
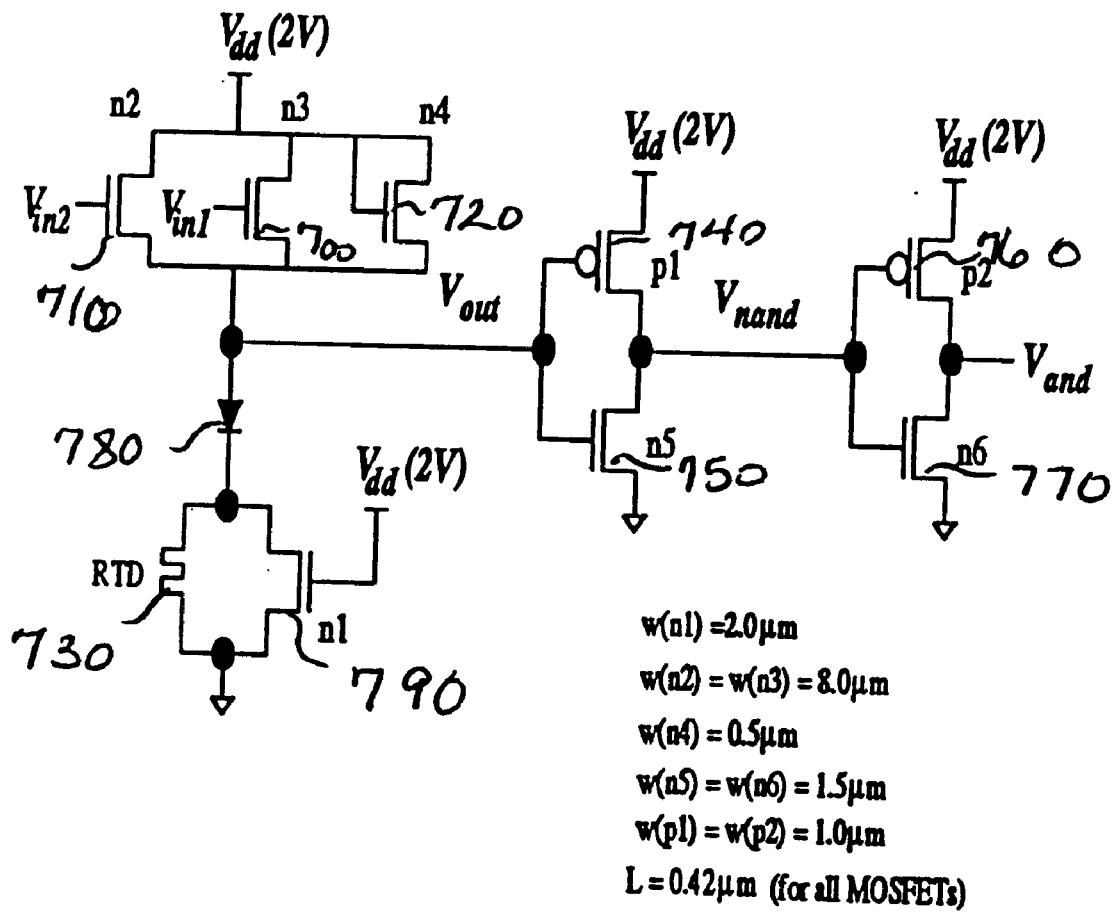
FIGS. 7A and 7B show a circuit diagram and I–V characteristics for a varying pull-up QMOS AND circuit.
Figure 7B:
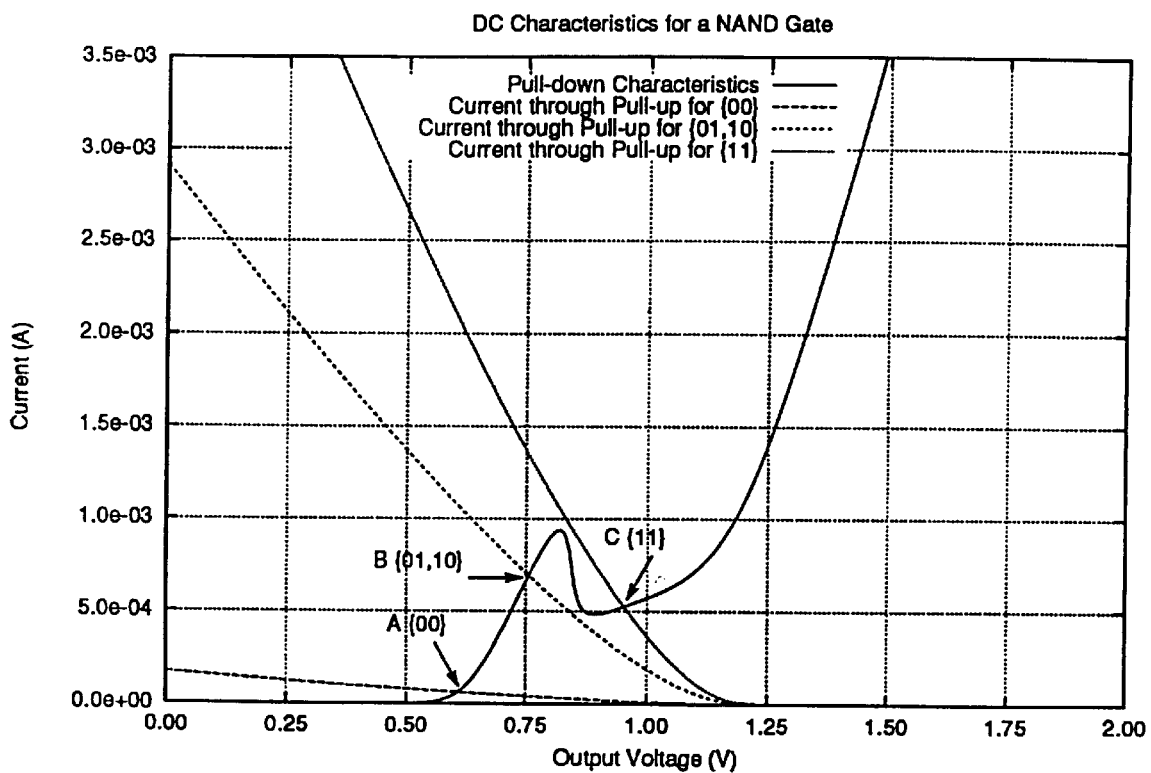

In an alternative embodiment, a QMOS varying pull-up embodiment of the present invention can be created by applying inputs to MOSFETs in the pull-up network, and using an RTD in the pull-down network. This type of network keeps the NDR characteristics of the RTD fixed, while moving the MOSFET characteristics to yield different operating points for different input combinations. For example, in FIG. 7A, a two input AND gate is shown in which the NMOSFETs 700, 710 and 720 are used as load for the RTD 730. This combination results in three different load lines depending upon which NMOSFETs 700 and/or 710 are turned on. As shown in FIG. 7B of the drawings, when the inputs ($V_{in1}$ and $V_{in2}$) for both NMOSFETs 700 and 710, respectively, are at logic "0", only transistor 720 is turned on, and the voltage at the node $V_{out}$ is 0.615 Volts, with the output being at logic "0", indicated by point A in FIG. 7B. When only one of the two inputs ($V_{in1}$ or $V_{in2}$) for the NMOSFETs 700 or 710, respectively, is at logic "1", the single MOSFET load line results in an operating point in the positive resistance region at the low voltage end, e.g., the output at node $V_{out}$ is at logic "0", indicated by point B in FIG. 7B. When both of the inputs ($V_{in1}$ and $V_{in2}$) for the NMOSFETs 700 and 710, respectively, are set to logic "1", the resulting load line gives an operating point in the positive resistance region near the high voltage end, e.g., the output at node $V_{out}$ is logic "1", indicated by point C in FIG. 7B.

As an example, for this gate, if the inputs are 0 Volts for logic "0" and 2 Volts for logic "1", the output voltages at the node $V_{out}$ are $\leq 0.12$ Volts for logic "0", and $\geq 1.69$ Volts for logic "1". The output at node $V_{out}$ can be fed through two inverters, each consisting of a PMOSFET 740 and 760 and an NMOSFET 750 and 770, respectively, connected in series, to generate an AND output and to restore the logic level. A diode 780 and an additional NMOSFET 790 shown in the pull-down network shift the RTD 730 NDR characteristics to intersect the I–V characteristics of the NMOSFETs 700, 710 and 720 in the pull-up network at the correct operating points. The diode 780 and additional NMOSFET 790 are not needed for an RTD 730 fabricated with the NDR characteristics shown in FIG. 7B.

Figure 8A:
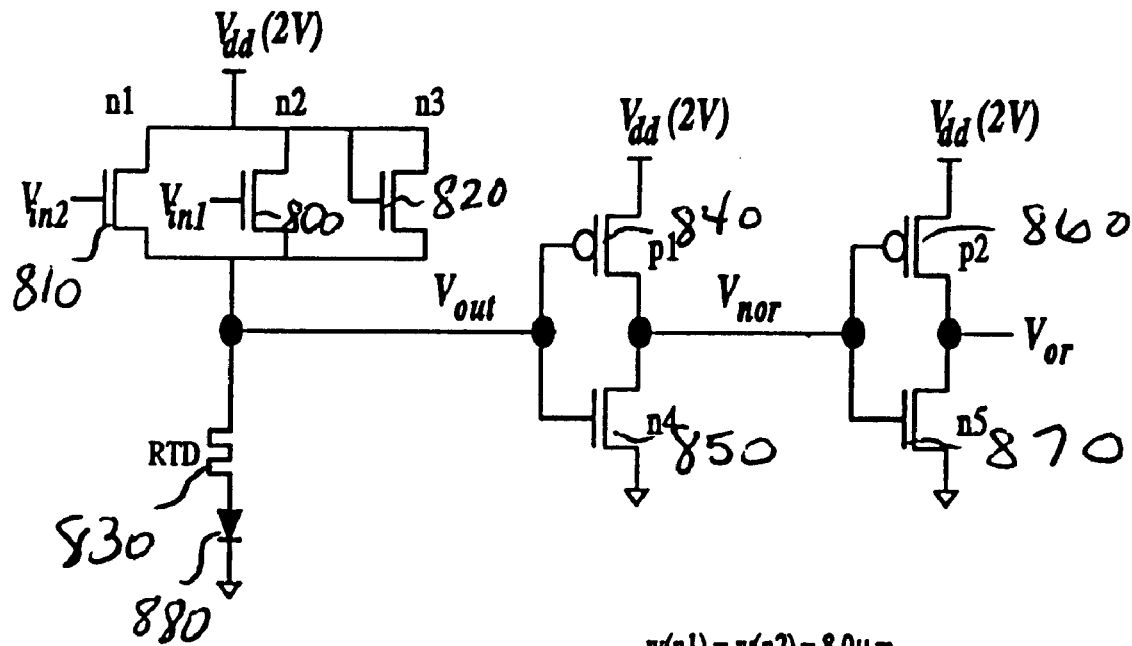
FIGS. 8A and 8B show a circuit diagram and I–V characteristics for a varying pull-up QMOS OR circuit.
Figure 8B:
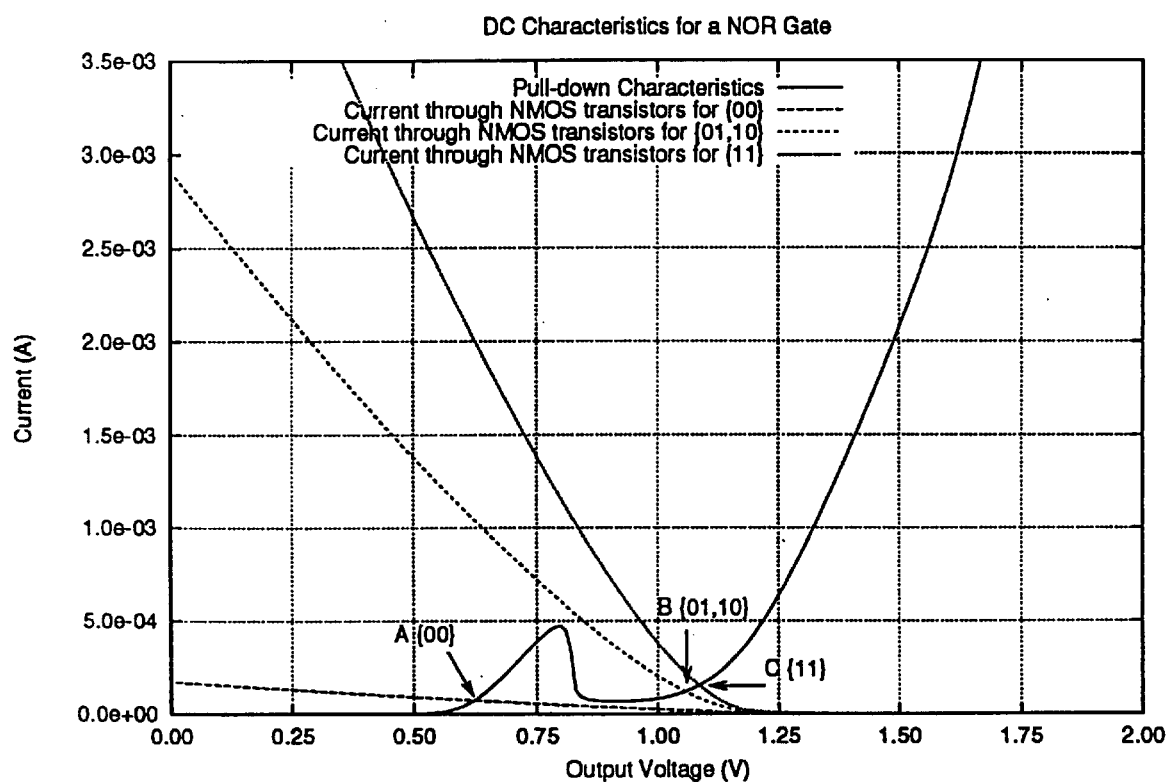

The QMOS varying pull-up AND gate described hereinabove can be converted to an OR gate simply by changing the cross-sectional area of the pull-down RTD 830 and removing the NMOSFET 790 in the pull-down network of the AND gate, as shown in FIG. 8A. This change in area decreases the RTD 830 current, which allows the output stable point for logic input combinations "01" and "10" to be at logic "1". The QMOS OR gate works in a fashion similar to the QMOS AND gate, except that the transistor 800, 810 and 820 parameters are such that the MOSFET load lines result in operating points that are different than those in the AND gate. As shown in FIG. 8B, at point A, the output logic is still at "0" when both inputs ($V_{in1}$ and $V_{in2}$) for the two NMOSFETs 800 and 810 are at logic "0", and at point C, the output logic is still at "1" when both inputs ($V_{in1}$ and $V_{in2}$) are at logic "1".

However, the MOSFET 800, 810 and 820 and RTD 830 parameters are chosen so that the operating points are near the high voltage region when only one of the inputs ($V_{in1}$ or $V_{in2}$) is at logic "1", indicated by point B in FIG. 8B. This can be achieved by decreasing the size of the RTD 830 such that the I–V characteristics with a single NMOSFET 800 or 810 on gives a logic "1" output. Once again, the OR output is achieved by feeding the $V_{out}$ through two inverters, each of which is made up of a PMOSFET 840 and 860 and an NMOSFET 850 and 870. As an example, for input voltages of 0 Volts for logic "0" and 2 Volts for logic "1", the output voltages are $\leq 0.10$ Volts for logic "0" and $\geq 1.97$ Volts for logic "1". The diode 880 shown in FIG. 8A connected to the RTD 830 serves to shift the RTD 830 characteristics, and as stated hereinbefore, is not needed for an RTD 830 with the NDR characteristics shown in FIG. 8B.

Advantageously, all of the logic circuits described hereinabove do not have transistors in series, in contrast with traditional CMOS logic gates, which do have transistors in series, which can reduce the propagation delay. With reference now to FIG. 9 of the drawings, as an example, the delay characteristics of fixed pull-up logic QMOS gates are compared with equivalent CMOS logic circuits. For this comparison, the area of both the circuits is kept almost the same and the circuits have been optimized for speed. From the table in FIG. 9, it can be observed that the number of devices required for the fixed pull-up QMOS logic gates is less than that required for equivalent CMOS gates.

In addition, as shown in FIG. 9, the NAND/AND, NOR/OR and Minority/Majority circuits have the same or better delay characteristics than their respective CMOS logic circuits. It should be noted that the QMOS Majority gate performs significantly better than the CMOS Majority gate, because delay in a ripple carry adder is determined by the carry propagation delay, which is improved in the QMOS Majority gate by the implementation of NMOSFET inputs in parallel with the RTD. Another advantage is that as more inputs are added to any of the aforedescribed logic gates, additional MOSFETs in series do not need to be added, which allows the propagation delay to be reduced as compared with conventional CMOS logic gates.

Figure 10:
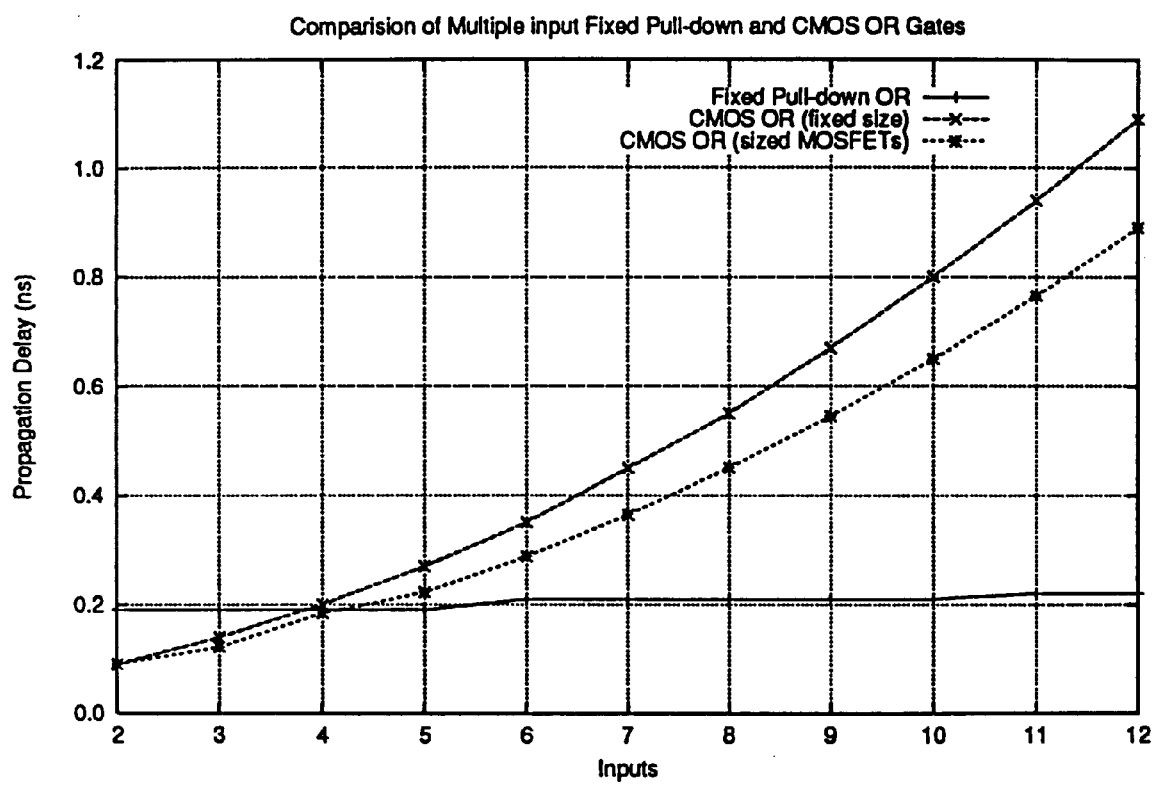
FIG. 10 is a graph illustrating the reduced propagation delay in QMOS fixed pull-up OR gates.

Furthermore, a graph illustrating the comparison of propagation delays of multiple input OR gates is shown in FIG. 10 of the drawings. As the results indicate, the QMOS fixed pull-down OR gate has little to no propagation delay as compared with standard CMOS OR gates.

As will be recognized by those skilled in the art, the innovative concepts described in the present application can be modified and varied over a wide range of applications. Accordingly, the scope of patented subject matter should not be limited to any of the specific exemplary teachings discussed.

What is claimed is:

1. A digital logic circuit, comprising:
   a pull-down circuit having at least two n-type transistors connected in parallel with a resonant tunneling diode, first and second inputs being applied to the gates of first and second ones of said n-type transistors, respectively; and
   a pull-up circuit having at least one p-type transistor operatively connected in series with said pull-down circuit,
   whereby propagation delay through said digital logic circuit is reduced.

2. The digital logic circuit of claim 1, wherein said n-type transistors are NMOSFETs.

3. The digital logic circuit of claim 1, wherein said p-type transistor is a PMOSFET.

4. The digital logic circuit of claim 1, further comprising an inverter operatively connected to said pull-up circuit and said pull-down circuit, the output of said pull-up circuit and said pull-down circuit being fed through said inverter.

5. The digital logic circuit of claim 4, wherein said inverter comprises an additional p-type transistor in series with an additional n-type transistor, the output of said pull-up circuit and said pull-down circuit being applied to the gates of said additional p-type transistor and said additional n-type transistor.

6. The digital logic circuit of claim 1, wherein said p-type transistor has a grounded gate.

7. The digital logic circuit of claim 1, wherein said digital logic circuit is a NAND/AND circuit.

8. The digital logic circuit of claim 1, wherein said digital logic circuit is a NOR/OR circuit, said p-type transistor and each said n-type transistor having a channel width, said channel width of said p-type transistor being narrow with respect to said channel width of each said n-type transistors.

9. The digital logic circuit of claim 1, further comprising a third n-type transistor within said pull-down circuit, said third n-type transistor being connected in parallel with said resonant tunneling diode.

10. The digital logic circuit of claim 9, wherein said digital logic circuit is a Minority/Majority circuit.

11. The digital logic circuit of claim 9, further comprising an additional pull-down circuit having an additional three n-type transistors connected in parallel with an additional resonant tunneling diode, said additional pull-down circuit being operatively connected to an additional pull-up circuit having a two additional p-type transistors connected in parallel, the output of said pull-up circuit and said pull-down circuit being applied to the gate of one said additional p-type transistors through an inverter.

12. The digital logic circuit of claim 11, wherein said digital logic circuit is a full adder circuit, the output of said pull-up circuit and said pull-down circuit being a carry out output, and the output of said additional pull-up circuit and said additional pull-down circuit being a sum output.

13. A digital logic circuit, comprising:

a pull-up circuit having at least three n-type transistors connected in parallel, first and second inputs being applied to the gates of first and second ones of said n-type transistors, respectively; and a pull-down circuit having a resonant tunneling diode operatively connected in series with said pull-up circuit, whereby propagation delay through said digital logic circuit is reduced.

14. The digital logic circuit of claim 13, wherein said n-type transistors are NMOSFETs.

15. The digital logic circuit of claim 13, wherein said digital logic circuit is an AND circuit.

16. The digital logic circuit of claim 13, wherein said digital logic circuit is an OR circuit.

17. The digital logic circuit of claim 13, wherein the output of said pull-down circuit and said pull-up circuit is fed through an inverter, said inverter having an additional n-type transistor connected in series with a p-type transistor, the output of said pull-down circuit and said pull-up circuit being applied to the gates of said additional n-type transistor and said p-type transistor.

18. The digital logic circuit of claim 17, wherein the output of said inverter is fed through an additional inverter.

19. The digital logic circuit of claim 13, wherein a third one of said n-type transistors has a gate attached to the drains of said first and second n-type transistors.

20. A full adder circuit, comprising:

a carry out circuit having first, second and third n-type transistors connected in parallel with a first resonant tunneling diode, first, second and third inputs being applied to the gates of said first, second and third n-type transistors, respectively, said first, second and third n-type transistors and said first resonant tunneling diode being connected in series with a first p-type transistor; and a sum circuit having fourth, fifth and sixth n-type transistors connected in parallel with a second resonant tunneling diode, said first, second and third inputs being applied to said fourth, fifth and sixth n-type transistors, respectively, said fourth, fifth and sixth n-type transistors being connected in series with a second p-type transistor, said second p-type transistor being connected in parallel with a third p-type transistor, the output of said carry out circuit being applied to the gate of said third p-type transistor through an inverter, whereby propagation delay through said carry out circuit is reduced.

21. The full adder circuit of claim 20, wherein said inverter comprises a seventh n-type transistor connected in series with a fourth p-type transistor the output of said carry out circuit being applied to the gates of said seventh n-type transistor and said fourth p-type transistor.

22. The full adder circuit of claim 20, wherein said first, second, third, fourth, fifth and sixth n-type transistors are NMOSFETs.

23. The full adder circuit of claim 20, wherein said first, second and third p-type transistors are PMOSFETs.

24. The full adder circuit of claim 20, wherein the gates of said first and second p-type transistors are connected to ground.

* * * * *

UNITED STATES PATENT AND TRADEMARK OFFICE
CERTIFICATE OF CORRECTION

PATENT NO : 6,130,559

DATED : October 10, 2000

INVENTOR(S) : Balsara, et al.

It is certified that error appears in the above-identified patent and that said Letters Patent are hereby corrected as shown below:

Column 4, line 42  Replace "MOSETs"
With --MOSFETs--

Signed and Sealed this

First Day of May, 2001

Attest:

NICHOLAS P. GODICI

*Attesting Officer*    *Acting Director of the United States Patent and Trademark Office*